SEMICONDUCTOR FABRICATION

Filed April 5, 1966 Sheet 1 of 2

INVENTORS
Hans-Jürgen Schütze &
Klaus Hennings

BY Spencer & Kaye
ATTORNEYS

INVENTORS
Hans-Jürgen Schütze &
Klaus Hennings
BY Spencer & Kaye
ATTORNEYS

United States Patent Office 3,419,955

Patented Jan. 7, 1969

3,419,955

SEMICONDUCTOR FABRICATION

Hans-Jürgen Schütze and Klaus Hennings, Ulm, Germany, assignors to Telefunken Patentverwertungsgesellschaft m.b.H., Ulm (Danube), Germany Filed Apr. 5, 1966, Ser. No. 540,266

Claims priority, application Germany, Apr. 17, 1965, T 28,418

U.S. Cl. 29—577 13 Claims

Int. Cl. H01l 7/68

ABSTRACT OF THE DISCLOSURE

A method for fabricating an assembly of semiconductor elements which are to be connected together to form a circuit, the assembly being formed by providing a plurality of individual semiconductor pellets each having positioning holes formed therein and at least some containing at least one semiconductor element, providing a positioning plate having groups of pellet-positioning studs thereon, with each group of studs being distributed to mate with the holes of at least one pellet, placing pellets on the positioning plate in mating relationship with corresponding groups of studs, and connecting the pellets rigidly together to form an assembly which can be readily removed from the positioning plate.

The present invention relates to the field of semiconductors, and particularly to a method for fabricating a group of semiconductor circuit elements.

In the construction of micro-miniaturized switching circuits, as well as other types of circuits, it is generally desired to place as many elements as possible on a single unit. This is so because of the fact that, in the known techniques for preparing such circuits, the manufacturing costs will scarcely increase with increases in the number of elements, so long as the yield in the fabrication process is maintained within admissible units. Moreover, external interconnection problems are eliminated when a single unit is provided with all of the elements of a multi-function circuit.

In addition, certain improvements occur in the operation of such a circuit if as many elements as possible are included in a single structure which structure may be fabricated, for example, according to the solid-state or thin-film techniques, or a combination thereof.

However, it is known that the utilization of the solid-state technique entails the problem that the yield of active elements on a single semiconductor wafer is not only limited, but also that defective circuit elements which are likely to break down increases as they are randomly distributed on the wafer. Therefore, the total physical size of the resulting structure has a maximum limit. It is already known in the art to provide between ten and one hundred individual elements on a single semiconductor body which is cut from a large wafer, with each body containing, for example, one circuit and being built into a separate housing. While the dimensions of the individual elements may theoretically be reduced so that, for a predetermined maximum size for the semiconductor body, a greater number of structural elements can be accommodated thereon, the result is not only an increase in the difficulties of manufacture but also the creation of heat dissipation problems and an increase in the probability of the appearance of defective elements. The heat dissipation problems can be solved only by drastically reducing the power consumption of each individual element, with the attendant result that the switching speeds, or effective cut-off frequencies, of the circuits are reduced.

In order to produce complete circuits having a large surface area, a good heat dissipation, and capable of being easily wired, it is already known in the art to proceed by applying a passive network onto an insulating substrate made of glazed ceramic material, for example, and to subsequently insert active elements into the circuit. It is also known that such a procedure presents difficulties with regard to the electrical connections of the active elements to the passive network.

Among the various solutions to these difficulties which have already been proposed is one in which the active elements are soldered in such a way that the emitter, base and collector contacts are connected with corresponding conductive paths on the insulating carrier plate, for example by means of face-bonding the pellets. In addition to the technical difficulties involved in inserting active elements into passive circuits, one of the serious drawbacks of arrangements of the above-described type is that each active element must be inserted and contacted individually, thereby increasing the cost, and reducing the reliability, of the resulting circuit. Moreover, such circuit elements exhibit rather poor heat dissipation because, on the one hand, dielectric materials such as ceramics are poor heat conductors and, on the other hand, in the last-mentioned technique, which is known as the "flip-over chip technique," the heat dissipation must take place via the leads. If, in contrast thereto, the active elements are inserted by soldering them on together with the entire semiconductor body, it is only possible to provide connections to the passive network by forming a plurality of thermo-compression contacts.

It has also already been proposed to fabricate such an arrangement by disposing a plurality of crystal chips, each of which contains either individual active and/or passive elements or a partial solid-state circuit, in a common insulating housing. The connection between the individual elements is again effected by the attachment of wires by means of thermo-compression. This technique is known as the "multi-chip technique." Such a circuit arrangement has the obvious drawback that the large number of thermo-compression contacts required prevents it from being fabricated economically. In addition, the great likelihood exists that large structures fabricated in this manner will contain short circuits and faulty connections.

It is a primary object of the present invention to eliminate these defects.

Another object of the present invention is to provide a multi-element semiconductor device having a high operating reliability.

Still another object of the present invention is to provide such an arrangement having a low cost of manufacture.

A still further object of the present invention is to provide a method of making a solid-state circuit having a large surface area for receiving a plurality of active semiconductor elements and/or circuits and having a high degree of adaptability to different circuit configurations, while retaining the intrinsic advantages of circuits produced according to the solid-state technique, such as a high degree of reliability, compact structure, and inexpensive construction.

These and other objects are attained, in accordance with the present invention, by the provision of a method for fabricating an assembly of semicondutcor elements to be connected together to form a circuit, which method includes providing a plurality of semiconductor pellets each having positioning holes formed therein, at least some of which pellets contain at least one semiconductor element, and providing a positioning plate having a plurality of groups of projecting, pellet-positioning studs thereon, the studs of each group being distributed to correspond with the holes in at least one of the pellets. The pellets are then placed on the positioning plate so that the holes of each pellet fit over a corresponding group of studs, and the pellets are rigidly connected together to form an assembly which is readily separable from the positioning plate.

In accordance with a preferred embodiment of the method of the present invention, the step of connecting the pellets rigidly together is carried out by filling the interstices between adjacent pellets, and covering these pellet surfaces which face away from the plate, with a glass solder mass, mounting a supporting semiconductor plate on the mass, and subjecting the resulting unit to a heat treatment for fusing the mass to the pellets and to the supporting plate.

Additional objects and advantages of the present invention will become apparent upon consideration of the following description when taken in conjunction with the accompanying drawings in which:

FIGURE 1*a* is a perspective view of a semiconductor pellet for use in the practice of the present invention.

FIGURE 1*b* is a partial, cross-sectional view of one embodiment of the arrangement of FIGURE 1*a*.

FIGURE 2*a* is a perspective view of an element used in the practice of the present invention.

FIGURE 2*b* is a partial cross-sectional view showing one stage in the production of the unit of FIGURE 2*a*.

FIGURE 2*c* is a view similar to that of FIGURE 2*b* showing a further stage in the construction of the element of FIGURE 2*a*.

Figures 1A, 1B:
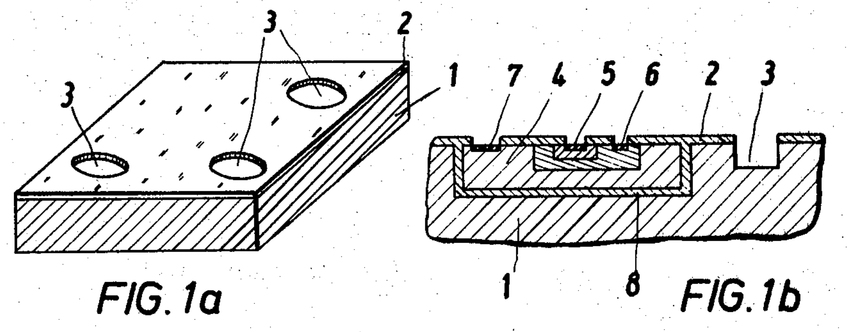

Referring now specifically to FIGURES 1*a* and 1*b*, there is shown the semiconductor body 1 of a semiconductor wafer, pellet, or chip, such as is customarily produced during the manufacture, for example, of planar transistors and integrated switching circuits according to the solid-state technique. Semiconductor body 1 is covered with an insulating layer 2 which is provided, in a manner known per se, for purposes of passivation. The body 1 is also provided with active and/or passive semiconductor elements which are not shown in FIGURE 1*a* for purposes of simplicity. Passivating layer 2 and semiconductor body 1 are also provided with positioning holes 3 by etching, for example, with the aid of the well-known photomasking technique. The purpose of these holes will be described in detail below.

FIGURE 1*b* is a cross-sectional view taken through one specific embodiment of the arrangement of FIGURE 1*a* and showing one type of semiconductor element which may be formed in the pellet. In this case, the element is constituted by a planar transistor 4 which has been formed in body 1 in a manner known per se. This transistor is provided with an emitter contact 5, a base contact 6 and a collector contact 7. In this case, the body 1 is made of a polycrystalline semiconductor material having a high resistivity and the monocrystalline material of the transistor 4 is embedded therein above the insulating layer 8. At least one positioning hole 3 is provided in the body 1 by etching, for example, so as to extend through the insulating layer 2 and into the semiconductor body 1 itself.

In a subsequent operation according to the present invention, a plurality of pellets of the type shown in FIGURES 1*a* and 1*b* are combined into a single solid-state circuit having a large surface area. For this purpose, and in accordance with a principal feature of the present invention, there is provided a positioning plate, preferably made of semiconductor material, having a plurality of positioning elements, or studs, disposed thereon.

Figure 2A:
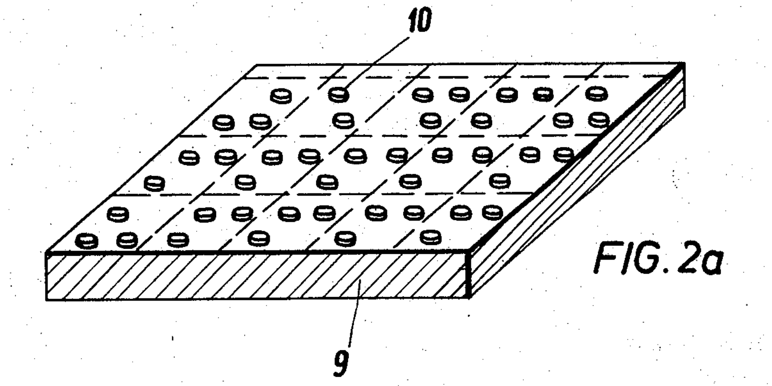

One such arrangement is shown in FIGURE 2*a* to include a large positioning plate 9 having a plurality of studs 10 disposed on one surface thereof. The broken lines on this surface define a plurality of rectangular areas each of which is provided for one semiconductor pellet of the type shown in FIGURE 1. These rectangular areas divide the studs 10 into a plurality of groups having varying stud distributions. The relative positions of the studs in each rectangular area correspond to the postiions of the group of holes in a particular type of semiconductor pellet, i.e., a pellet having a particular arrangement of semiconductor elements. The dimensions of the studs 10 are made so that they will mate with the holes 3 in a corresponding semiconductor pellet. Each of the studs preferably has a height of the order of 3 to 5$\mu$.

Each semiconductor pellet to be positioned on plate 9 has a group of holes 3 whose number and distribution are selected to correspond to the particular arrangement of semiconductor elements on that pellet. Similarly, the group of studs in each rectangular area on plate 9 is so arranged as to be able to properly receive only pellets having one particular hole configuration. Therefore, each rectangular area on plate 9 can only receive a semiconductor pellet having a particular group of circuit elements disposed thereon in a particular manner. As a result, it is impossible once the studs 10 have been properly placed on the plate 9, to place the wrong semiconductor pellet on any rectangular area of plate 9.

Figure 2B:
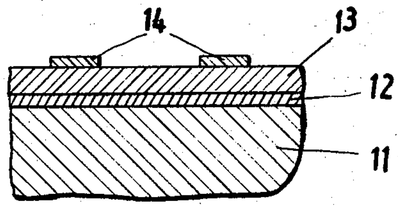
Figure 2C:
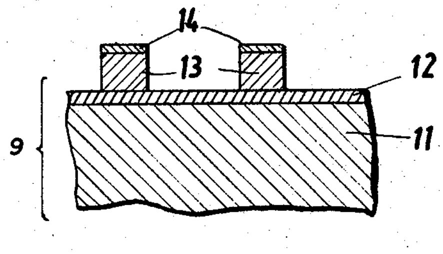

One manner of constructing the arrangement of FIGURE 2*a* is shown in detail in FIGURES 2*b* and 2*c*. As is shown in FIGURE 2*b*, there may first be provided a body 11 of polycrystalline semi-conductor material, which is preferably made of the same material as that of semiconductor body 1 in order to assure that bodies 1 and 11 will have identical coefficients of thermal expansion. An insulating layer 12 is deposited on body 11, this layer being constituted, for example, by an oxide of the material of body 11. A polycrystalline semiconductor layer 13, which is preferably of the same material as body 11, is then deposited on insulating layer 12. A further layer of insulating material, which may be an oxide of layer 13, is then deposited on layer 13 and portions thereof are removed, by selective etching for example, to leave the isolated disc-shaped regions 14. One region 14 is provided for each stud 10 to be produced. Layer 13 is then selectively etched away around regions 14 to form the resulting studs, the depth of this etching being limited by the presence of insulating layer 12. A positioning plate having the form shown in FIGURE 2*a* is thus produced.

In order to permit the method according to the present invention to be properly carried out, it is necessary that the lateral dimensions of the studs constituted by regions 14 and the remaining portions of semiconductor layer 13 be precisely controlled because the accuracy of these dimensions determines the accuracy with which the pellets of FIGURES 1*a* and 1*b* can be positioned on plate 9. It is also necessary that the surface of plate 9 be extremely flat, which condition can be easily satisfied if plate 9 is manufactured starting from a body 11 having a mechanically lapped and polished surface.

Figure 3:
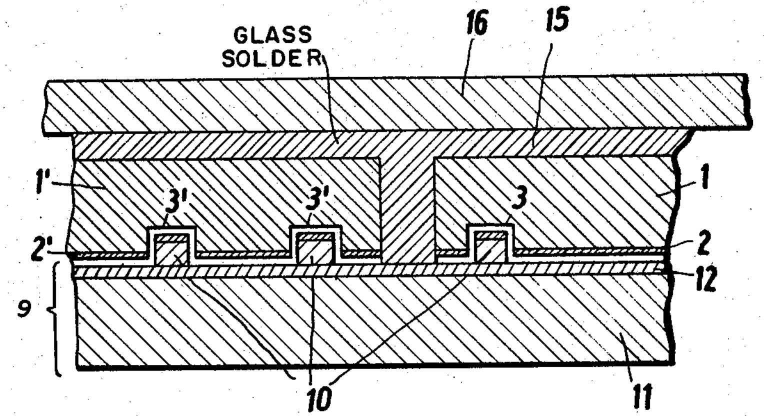
FIGURE 3 is a partial, cross-sectional view showing an intermediate stage in the construction of a semiconductor arrangement according to the present invention.

Once the positioning plate 9 has been provided, the previously prepared pellets, such as that shown in FIGURES 1*a* and 1*b*, are positioned on the adjusting plate 9 so that each stud 10 will be positioned in a corresponding opening 3. Such an arrangement is shown in FIGURE 3 wherein pellets constituted by two semiconductor bodies 1 and 1' having respective insulating layers 2 and 2' disposed thereon are positioned on a mounting plate constituted by a semiconductor body 11 and an insulating layer 12 from which extends a group of studs 10. Each stud 10 is positioned in a positioning hole 3 or 3' of body 1 or 1'. The mounting of the semiconductor pellets may be accomplished automatically, for example, by means of a mechanical device which is arranged to place the pellets so that their holes 3 or 3' fit over the respective studs 10.

The present invention can also be employed to great advantage in the fabrication of a semiconductor arrangement starting from a single, relatively large supporting body having a large number of semiconductor elements formed therein and provided with a suitable arrangement of positioning holes. The elements and partial circuits originally formed in this body are first tested and defective elements or partial circuits are marked. In addition, those elements or partial circuits which are not needed for the particular circuit to be constructed are also marked. Then, the semiconductor body is mounted on a positioning plate, such as the plate 9 of FIGURE 2*a* and is divided into a group of individual pellets, for example along the broken lines of FIGURE 2*a*. Thereafter, those pellets which have been previously marked as containing defective or undesirable elements or partial circuits are removed or replaced by identical, operative elements or partial circuits or by different elements or partial circuits. This procedure greatly facilitates the fabrication of a complete semiconductor unit since it combines the advantages of initially fabricating a large number of elements on a single body with the ability to fabricate a large variety of semiconductor arrangements and to replace defective elements according to the present invention.

Once all of the desired, pre-tested elements or partial circuits are mounted on the positioning plate, either by positioning a number of individual pellets or by replacing selected pellets of a relatively large semiconductor body, the insulating layer 12 of the positioning plate and the insulating layers, such as the layers 2 and 2', of the individual wafers, are brought into as close a contact as possible. In this connection, it should be noted that the spaces shown between elements in FIGURE 3 are greatly exaggerated for illustrative purposes.

Then, as is shown in FIGURE 3, the interstices between adjacent semiconductor pellets are filled with a mass 15 of a suitable material, such as glass solder. If, for example, the semiconductor bodies 1 and 1' are made of silicon, the mass 15 could be made of a lead-boron silicate glass. The material of mass 15 is also applied to those surfaces of the semiconductor pellets which face away from the positioning plate. A supporting plate 16 having good thermal conductivity is then disposed on the filler mass 15, the plate 16 being sufficiently large to extend over all of the semiconductor pellets mounted on the positioning plate and being made of a material which has the same coefficient of thermal expansion as the material of bodies 1 and 1'. For example, plate 16 can be made of the same material as the bodies 1 and 1'.

Subsequently, the entire resulting arrangement is subjected to a heat treatment the maximum temperature of which is maintained slightly below the eutectic temperature for the recrystallization zones of the active semiconductor elements, such as the transistor 4 of FIGURE 1*b*, formed in the semiconductor pellets. This heat treatment is intended to create an integral unit by fusing together the semiconductor bodies and the filler material 15. In the case of silicon semiconductor bodies, the temperature of this treatment is of the order of 450° C. to 550° C.

In order to prevent the mass 15 from adhering to the surface of insulating layer 12 in the region where they come into contact, layer 12 is preferably coated with a thin layer of a substance, such as graphite, which will not bond with the glass solder constituting mass 15.

Figure 4:
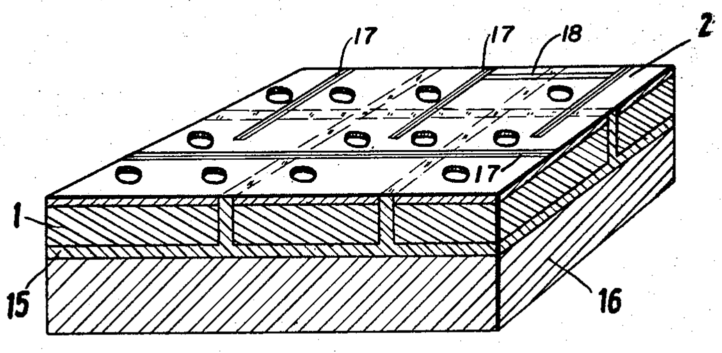
FIGURE 4 is a perspective view showing a final stage of construction according to the present invention.

Positioning plate 9 is then separated from the resulting semiconductor assembly, leaving the device shown in FIGURE 4 in which the plate 16 supports the pellets 1 and the connecting mass 15. The resulting arrangement has a perfectly smooth, flat upper surface due to the fact that the spaces between adjacent insulating layers 2 are filled by the mass 15 of fused glass solder.

Then, conductive paths 17 are provided and, if desired, passive elements such as resistance 18 are deposited on the surface defined by layers 2 by evaporation or vapor deposition.

It may thus be seen that one of the important advantages of the present invention resides in the fact that conductive paths and passive elements can be applied to the resulting relatively large semiconductor arrangement solely by means of a masking technique and vaporization processes without it being necessary to wire the circuit by means of thermo-compression. The use of the masking technique for applying conductive paths and passive elements is made possible, in the present invention, because a predetermined relative positioning of each individual semiconductor element is maintained throughout the entire fabrication process.

The present invention provides several further improvements over the prior art, some of which are:

(1) A good heat dissipation in the resulting circuit.

(2) The capability of forming a single unit made up of different types of elements and/or partial circuits each of which may be individually fabricated on a mass production basis.

(3) The ability to pre-test individual elements or partial circuits and to eliminate those which are faulty before assembling the complete unit.

(4) The capability of achieving high production rates due to the fact that the individual pellets can be separately manufactured and electrically tested.

(5) The capability of storing pre-fabricated and pre-tested pellets and of assembling these pellets into a large variety of complete units to the purchaser's specifications.

(6) The capability of forming entire units constituted by pellets having different oxide layer thicknesses, the thickness of the oxide layer of each pellet being selected on the basis of various considerations, such as the reduction of the shunt capacitances associated with various subsequently deposited passive elements.

(7) The ability to manufacture a complete semiconductor unit some of the component pellets of which are fabricated with insulating oxide layers on top of the pellets, while others are fabricated from completely insulating bodies of a different material having a matched coefficient of thermal expansion.

(8) The ability to readily form relatively large capacitors on some component pellets, which do not contain other semiconductor elements, in order, for example, to produce low frequency linear RC-amplifiers or similar components which require large capacitances.

(9) The capability of providing a complete unit of which some of the individual pellets contain replacement elements, thereby permitting the resulting semiconductor unit to be subsequently repaired if one of the originally connected circuit elements should become inoperative.

It has been found that semiconductor assemblies produced according to the present invention can be provided with an extremely large number of elements, it being readily possible to provide such an assembly having in excess of 500 individual elements. Moreover, this can be accomplished without giving the individual elements extremely small dimensions and without encountering the limitation previously imposed on the number of elements which could be placed on a single unit constructed according to the prior art techniques due to the fact that the probability of the occurrence of defective elements increases with the total number of elements in the unit.

Moreover, the present invention eliminates the need for complicated procedures for laying out the circuit in order to utilize in an optimum manner the portions of a semiconductor body which are free of defects. This is true because the present invention permits a semiconductor circuit to be constructed from a plurality of relatively small pellets having widely varying characteristics, each of the pellets being capable of being produced by a separate process which permits the properties of each individual pellet to be optimized with respect to the individual element or elements which it is to contain. Moreover, the element or elements of each individual pellet can be electrically tested before the pellet is incorporated in a complete unit.

It may thus be seen that the present invention involves a manufacturing process which permits complete semiconductor units to be fabricated at a high production rate and with a high degree of reliability. The present invention permits a high degree of flexibility to exist in the production process because a wide variety of circuit units can be constructed from a relatively small number of prefabricated elements, each of which elements is disposed on a respective pellet. In addition, arrangements fabricated according to the novel method of the present invention are capable of being provided with passive circuit elements and conductive leads in a very simple and reliable manner.

It will be understood that the above description of the present invention is susceptible to various modifications, changes and adaptations, and the same are intended to be comprehended within the meaning and range of equivalent of the appended claims.

What is claimed is:

1. A method for fabricating an assembly of semiconductor elements to be connected together to form a circuit, comprising the steps of:

(a) providing a plurality of semiconductor pellets each having positioning holes formed therein, at least some of said pellets containing at least one semiconductor element;

(b) providing a positioning plate having a plurality of groups of projecting pellet-positioning studs thereon, the studs of each said group being distributed to correspond with the holes of at least one of said pellets;

(c) placing said pellets on said positioning plate so that the holes of each said pellet fit over a corresponding group of studs; and (d) connecting said pellets rigidly together to form an assembly which is readily separable from said positioning plate.

2. A method as defined in claim 1 wherein said step of connecting said pellets together is carried out by filling the interstices between adjacent pellets, and covering the pellet surfaces which face away from said positioning plate, with a glass solder mass; mounting a supporting semiconductor plate on said mass; and subjecting the resulting unit to a heat treatment for fusing said mass to said pellets and to said supporting plate.

3. A method as defined in claim 2 comprising the further steps of: separating said positioning plate from the unit defined by said pellets, said mass, and said supporting plate; and forming conductive paths and passive elements on the surface of said unit which faces away from said supporting plate.

4. A method as defined in claim 3 wherein said plurality of pellets are originally provided in the form of a single semiconductor body, having a plurality of portions each representing a pellet, some of which portions are to be removed or replaced, and comprising the additional steps of: dividing said body so as to separate said portions into individual pellets after said body has been placed on said positioning plate; and, before said step of connecting, removing those pellets to be removed and replacing those pellets to be replaced.

5. A method as defined in claim 4 wherein at least one pellet to be replaced is replaced by a pellet made entirely of an insulating material whose thermal expansion coefficient is substantially equal to that of the semiconductor pellets of the entire unit.

6. A method as defined in claim 3 wherein said step of forming conductive paths and passive elements is carried out by vapor deposition.

7. A method as defined in claim 3 wherein said step of forming conductive paths and passive elements is carried out by evaporation.

8. A method as defined in claim 2 wherein at least one semiconductor element contained by said pellets is an active element having recrystallization zones and said step of subjecting the resulting unit to a heat treatment is carried out by heating the unit to a maximum temperature which is slightly lower than the eutectic temperature of the recrystallization zones of the elements contained in said pellets.

9. A method as defined in claim 2 wherein said supporting plate is made of a material whose coefficient of thermal expansion is substantially equal to that of the bodies of said semiconductor pellets.

10. A method as defined in claim 9 wherein said supporting plate is made of the same material as the bodies of said semiconductor pellets.

11. A method as defined in claim 1 wherein said step of providing a plurality of pellets is carried out by providing a carrier body of polycrystalline semiconductor material for each pellet, covering at least one surface of each said body with an insulating layer, and embedding at least one semiconductor element constituted by a monocrystalline semiconductor region in said polycrystalline material of each said body.

12. A method as defined in claim 1 wherein said step of connecting said pellets together is carried out by filling the interstices between adjacent pellets with a glass solder and said step of providing a positioning plate includes the operation of coating that surface of said positioning plate from which said studs project with a layer of graphite for preventing glass from binding with said positioning plate surface.

13. A method as defined in claim 1 wherein said step of providing a positioning plate is carried out by: providing a layer of polycrystalline semiconductor material having an insulating layer composed of an oxide of said material on one surface thereof; disposing a second layer of polycrystalline semiconductor material on said insulating oxide layer; disposing a second insulating layer on said second layer of polycrystalline semiconductor material; removing portions of said second insulating layer to leave an isolated region thereof at each point corresponding to the desired location of one of said studs; and selectively etching away portions of said second layer of polycrystalline material in the areas around said isolated regions of said second insulating layer; whereby the remaining portions of said second insulating layer and said second layer of polycrystalline material constitute said studs.

References Cited

UNITED STATES PATENTS

| | | | |
|---|---|---|---|
| 3,040,416 | 6/1962 | Matlow et al. | 29—577 X |
| 3,256,589 | 6/1966 | Warren | 29—624 |
| 3,290,756 | 12/1966 | Dreyer | 29—626 |

OTHER REFERENCES

"Proceedings of the IEEE," December 1964, pp. 1655–1657.

WILLIAM I. BROOKS, *Primary Examiner.*

U.S. Cl. X.R.

317—101; 29—624